(12) United States Patent
Kelly et al.

(10) Patent No.: US 11,436,516 B2
(45) Date of Patent: Sep. 6, 2022

(54) INTEGRATING CIRCUIT ELEMENTS IN A STACKED QUANTUM COMPUTING DEVICE

(71) Applicant: Google LLC, Mountain View, CA (US)

(72) Inventors: Julian Shaw Kelly, Santa Barbara, CA (US); Joshua Yousouf Mutus, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 368 days.

(21) Appl. No.: 16/493,400

(22) PCT Filed: Dec. 15, 2017

(86) PCT No.: PCT/US2017/066574
§ 371 (c)(1),
(2) Date: Sep. 12, 2019

(87) PCT Pub. No.: WO2018/169585
PCT Pub. Date: Sep. 20, 2018

(65) Prior Publication Data
US 2020/0012961 A1    Jan. 9, 2020

Related U.S. Application Data

(60) Provisional application No. 62/470,694, filed on Mar. 13, 2017.

(51) Int. Cl.
*H01L 39/14*         (2006.01)
*G06N 10/00*         (2022.01)
*H01L 25/065*        (2006.01)

(52) U.S. Cl.
CPC ......... *G06N 10/00* (2019.01); *H01L 25/0657* (2013.01); *H01L 39/14* (2013.01)

(58) Field of Classification Search
CPC .......... H03K 19/195–1958; H01L 39/223–226
See application file for complete search history.

(56) References Cited

U.S. PATENT DOCUMENTS 4,563,695 A * 1/1986 Tarutani ................ H01L 39/223
                                                              327/527
5,548,130 A * 8/1996 Shimizu ................ H01L 39/223
                                                               257/31
(Continued)

FOREIGN PATENT DOCUMENTS

JP    H09205232     8/1997
JP    2016511534    4/2016
(Continued)

OTHER PUBLICATIONS

Npj Quantum Information vol. 2, Article No. 16002 (2016) (Year: 2016).*

(Continued)

*Primary Examiner* — Jarrett J Stark
(74) *Attorney, Agent, or Firm* — Fish & Richardson P.C.

(57) ABSTRACT

A stacked quantum computing device including a first chip that includes a first dielectric substrate and a superconducting qubit on the first dielectric substrate, and a second chip that is bonded to the first chip and includes a second dielectric substrate, a qubit readout element on the second dielectric substrate, a control wire on the second dielectric substrate, a dielectric layer covering the control wire, and a shielding layer covering the dielectric layer.

15 Claims, 10 Drawing Sheets

(56) References Cited

U.S. PATENT DOCUMENTS

| | | | |
|---|---|---|---|
| 9,455,392 B2* | 9/2016 | Abraham | H01P 7/086 |
| 9,836,699 B1* | 12/2017 | Rigetti | G06N 10/00 |
| 10,305,015 B1* | 5/2019 | Brink | H01L 39/2406 |
| 10,535,809 B1* | 1/2020 | Vodrahalli | H01L 39/025 |
| 10,593,858 B2* | 3/2020 | Brink | H01P 1/20381 |
| 10,769,546 B1* | 9/2020 | Rigetti | H01L 27/18 |
| 10,811,588 B2* | 10/2020 | Olivadese | H01L 39/24 |
| 10,978,631 B2* | 4/2021 | Holmes | H01L 39/045 |
| 11,011,693 B2* | 5/2021 | Lampert | G06N 10/00 |
| 11,184,006 B2* | 11/2021 | Wang | H03K 19/195 |
| 11,223,355 B2* | 1/2022 | Smith | H03K 17/92 |
| 2007/0158791 A1* | 7/2007 | Wakana | H01L 27/18 257/659 |
| 2010/0133514 A1 | 6/2010 | Bunyk et al. | |
| 2014/0264287 A1* | 9/2014 | Abraham | H01P 7/086 257/31 |
| 2015/0357550 A1* | 12/2015 | Schoelkopf, III | H01L 39/24 257/31 |
| 2015/0372217 A1* | 12/2015 | Schoelkopf, III | H01L 39/2406 505/413 |
| 2018/0013052 A1* | 1/2018 | Oliver | G06N 10/00 |
| 2018/0069288 A1* | 3/2018 | Minev | H01L 39/02 |
| 2018/0145631 A1* | 5/2018 | Berkley | H01P 7/08 |
| 2020/0058702 A1* | 2/2020 | Kelly | H01L 25/0657 |
| 2020/0119251 A1* | 4/2020 | Yohannes | H01L 24/05 |
| 2020/0161531 A1* | 5/2020 | Olivadese | H01L 39/223 |
| 2021/0328127 A1* | 10/2021 | Kwon | H01L 39/223 |

FOREIGN PATENT DOCUMENTS

| | | |
|---|---|---|
| WO | WO 2014/168665 | 10/2014 |
| WO | WO 2018/212041 | 3/2020 |

OTHER PUBLICATIONS

R. N. Das et al., "Cryogenic Qubit Integration for Quantum Computing," 2018 IEEE 68th Electronic Components and Technology Conference (ECTC), 2018, pp. 504-514 (Year: 2018).*

Rosenberg, Danna et al. "Solid-State Qubits: 3D Integration and Packaging." IEEE Microwave Magazine 21: 72-85. (Year: 2019).*

EP Communication pursuant to Article 94(3) EPC in European Appln No. 17825709.3, dated Jan. 31, 2020, 9 pages.

PCT International Search Report and Written Opinion in International Application No. PCT/US2017/066574, dated Apr. 6, 2018, 23 pages.

Kelly, "Fault-tolerant superconducting qubits" Mar. 2015, [retrieved on May 3, 2018], retrieved from: URL <https://web.archive.org/20170204090310/http://web.physics.ucsb.edu:80/-martinisgroup/theses.shtml, 68 pages.

Qiuping et al, "Electroplated indium bump arrays and the bonding reliability" Journal of Semiconductors, Jan. 2010, 6 pages.

PCT International Preliminary Report on Patentability in International Application No. PCT/US2017/066574, dated Jun. 5, 2019, 19 pages.

JP Decision to Grant Patent in Japanese Appln. No. 2019-550195, dated Nov. 16, 2020, 5 pages (with English translation).

KR Notice of Allowance in Korean Appln. No. 10-2019-7026011, dated Nov. 25, 2020, 3 pages (with English translation).

EP Extended Search Report in European Appln. No. 21153943.2, dated Jun. 22, 2021, 12 pages.

KR Office Action in Korean Appln. No. 10-2019-7026011, dated Sep. 18, 2020, 8 pages (with English translation).

* cited by examiner

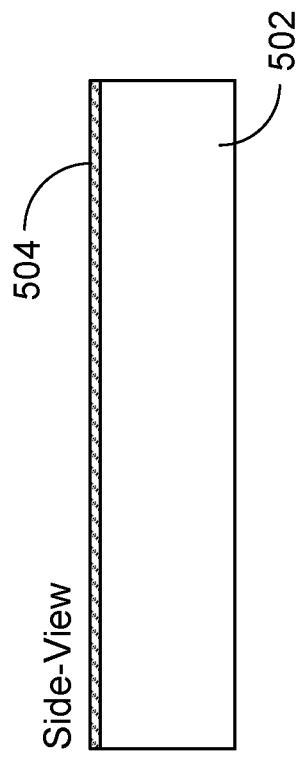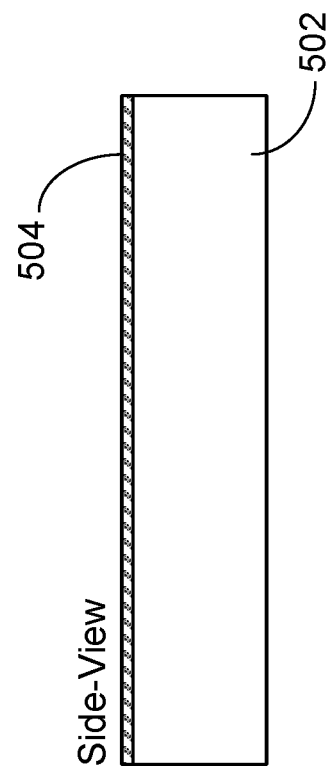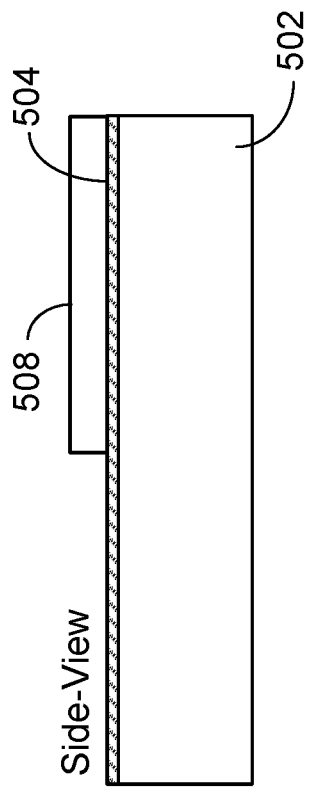
FIG. 5A  FIG. 5B  FIG. 5C
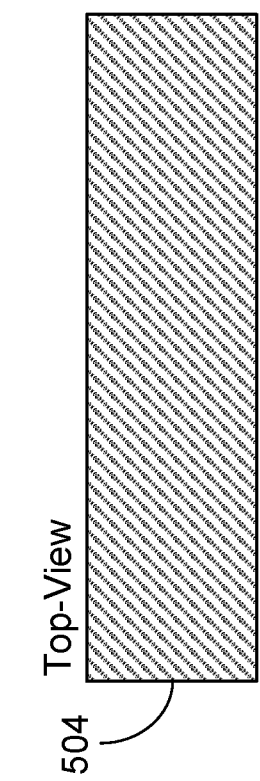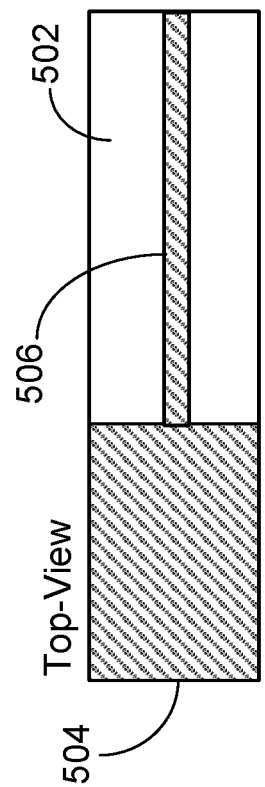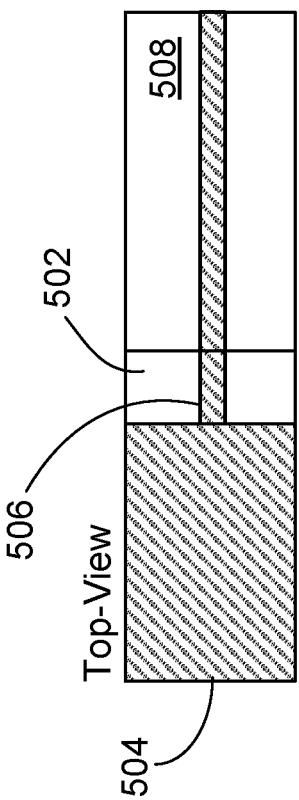

INTEGRATING CIRCUIT ELEMENTS IN A STACKED QUANTUM COMPUTING DEVICE

This application is a national stage application under 35 U.S.C. § 371 of PCT International Application No. PCT/US2017/066574, filed Dec. 15, 2017, which claims the benefit of U.S. Provisional Application Ser. No. 62/470,694, filed Mar. 13, 2017. The contents of the foregoing applications are hereby incorporated by reference.

TECHNICAL FIELD

The present disclosure relates to integrating circuit elements in stacked quantum computing device.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the present disclosure relates to a device including a first chip that includes a first dielectric substrate and a superconducting qubit on the first dielectric substrate, and a second chip that is bonded to the first chip and includes a second dielectric substrate, a qubit readout element on the second dielectric substrate, a control wire on the second dielectric substrate, a dielectric layer covering the control wire, and a shielding layer covering the dielectric layer.

In some implementations, the dielectric layer covering the control wire includes an opening through which the qubit readout element is exposed.

In some implementations, the dielectric layer includes a dielectric material having a loss tangent greater than about 1e−5 at a frequency between about 1 GHz and about 10 GHz.

In some implementations, the superconducting qubit on the first chip includes a readout region and where the qubit readout element overlaps the readout region of the qubit.

In some implementations, the qubit readout element includes a resonator element electrically coupled to a pad element, where the pad element overlaps the readout region of the superconducting qubit without the resonator element overlapping the readout region of the superconducting qubit.

In some implementations, the first chip includes a superconductor ground plane, where the resonator element on the second chip overlaps the superconductor ground plane.

In some implementations, the dielectric layer includes a via extending from a surface of the dielectric layer through the dielectric layer to the control wire. Additionally, the dielectric layer includes an interconnect within the via and electrically coupled to the control wire, and a control contact on the surface of the dielectric layer and electrically coupled to the interconnect.

In some implementations, the control contact is laterally surrounded by the shielding layer and physically separate from the shielding layer.

In some implementations, the control contact overlaps the superconducting qubit.

In some implementations the control contact is displaced laterally from the superconducting qubit without overlapping with the superconducting qubit.

In some implementations, the shielding layer covers a sidewall of the dielectric layer.

In some implementations, each of the qubit readout element, the control wire, and the shielding layer include superconductor material.

In some implementations, the second chip includes multiple control wires and multiple dielectric layers where shielding layers covering the multiple dielectric layers.

In some implementations, the first chip is bump bonded to the second chip.

In some aspects, the present disclosure relates to methods including providing a first dielectric substrate, forming a first superconductor layer on the first dielectric substrate, patterning the first superconductor layer such that the first superconductor layer includes a qubit control wire, forming a dielectric layer on the first superconductor layer including the qubit control wire, patterning the dielectric layer to provide a patterned dielectric layer, forming a second superconductor layer on the patterned dielectric layer, and patterning the second superconductor layer and the first superconductor layer to provide a qubit readout element.

In some implementations, patterning the dielectric layer includes forming a via in the dielectric layer to expose a portion of the control wire where the via extends from a surface of the dielectric layer to the portion of the control wire that is exposed.

In some implementations, forming the second superconductor layer includes forming an interconnect within the via where the interconnect contacts the portion of the control wire that is exposed.

In some implementations, patterning the second superconductor layer includes forming a control contact on the surface of the dielectric layer.

In some implementations, a second dielectric substrate including a superconducting qubit is bonded to the first dielectric substrate including the qubit readout element.

In some implementations, the first dielectric substrate with the second dielectric substrate prior are aligned prior to bonding such that the qubit readout element overlaps with the superconducting qubit.

In general, in some aspects, the subject matter of the present disclosure may be embodied in methods of operating a quantum computational system, in which operating the quantum computational system includes operating a quantum computing device. The quantum computing device includes, e.g., a first chip that includes a first dielectric substrate and a superconducting qubit on the first dielectric substrate, and a second chip that is bonded to the first chip and includes a second dielectric substrate, a qubit readout element on the second dielectric substrate, a control wire on the second dielectric substrate, a dielectric layer covering the control wire, and a shielding layer covering the dielectric layer. Operating the quantum computing device can include using the quantum computing device to coherently process quantum information stored in the superconducting qubit. Operating the quantum computational system may further include obtaining an output from the quantum computational system, and processing the output using classical circuit elements.

Particular embodiments of the subject matter described in this specification can be implemented to realize one or more of the following advantages. For example, in some implementations, the lossy materials and qubit control wiring may be formed on one or more chips within the stack that are separate from the chip containing the qubits. By limiting the chip containing the qubits to high quality (low loss) materials, the qubits are substantially isolated from lossy material and qubit decoherence can be reduced. By moving the control wiring off the chip that contains the qubits, the qubit layout and wiring constraints may be relaxed. To further relax the layout constraints, the qubit readout elements also may be moved to the same chip on which the wiring and lossy materials are formed. To limit interference between superconducting qubits on a first chip from control elements and wiring on a second chip, the control elements and wiring may be covered by a shielding layer and a dielectric layer. To maintain qubit readout element coherence, the qubit readout element may be provided without a dielectric layer or shielding layer. Additionally, in some implementations, the devices and methods allow an increase in superconducting qubit density and/or qubit coupling through 3D integration. Moreover, the fabrication steps for the superconducting qubits and the wiring/control elements are separated by putting the superconducting qubits on a first chip and the wiring/control elements on a second, separate chip. Furthermore, in some implementations, the devices and methods allow 3D integration to be achieved while reducing losses associated with processing methods and materials. In particular, by patterning qubit readout resonator structures during final steps of the fabrication process, the edges and corners of qubit readout resonator structures which are sensitive to processing (e.g., roughening) are of higher quality, resulting in improved device quality factors.

The details of one or more embodiments are set forth in the accompanying drawings and the description below. Other features and advantages will be apparent from the description, the drawings, and the claims.

DETAILED DESCRIPTION

Figure 1A:
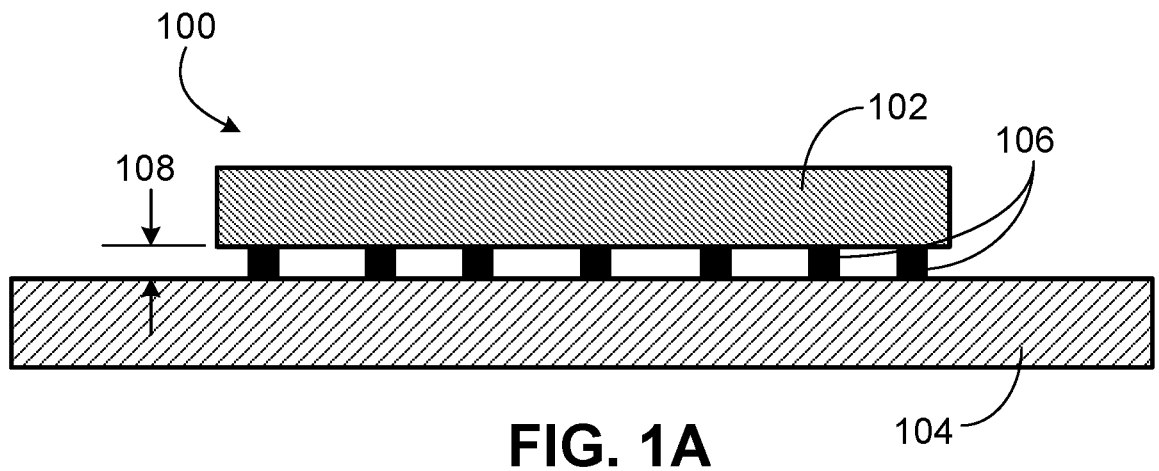
FIG. 1A is a schematic illustrating a side view of an example of a stacked quantum computing device.

Quantum computing entails coherently processing quantum information stored in the quantum bits (qubits) of a quantum computer. Superconducting quantum computing is a promising implementation of quantum computing technology in which quantum computing circuit elements are formed, in part, from superconductor materials. Superconducting quantum computers are typically multilevel systems, in which only the first two levels are used as the computational basis. In certain implementations, quantum circuit elements (e.g., quantum computing circuit elements), such as superconducting qubits, are operated at very low temperatures so that superconductivity can be achieved and so that thermal fluctuations do not cause transitions between energy levels. Additionally, it may be preferable that the quantum computing circuit elements are operated with low energy loss and dissipation (e.g., the quantum computing circuit elements exhibit a high quality factor. Q). Low energy loss and dissipation may help to avoid, e.g., quantum decoherence.

In certain types of quantum computing processors, such as quantum annealers, the superconducting qubits of the quantum processor are operatively coupled together in a controllable manner such that the quantum state of each superconducting qubit affects the corresponding quantum states of the other superconducting qubits to which it is coupled. Depending on the processor design, the chosen architecture may limit the density and total number of superconducting qubits available for coupling, and thus limit the ability of the processor to perform complex problems requiring large numbers of superconducting qubits. Furthermore, in certain quantum computing designs, the superconducting qubits may suffer energy loss and decoherence due to interactions with two level systems. For instance, in quantum computers that use superconducting qubits formed from superconductor materials, the presence of lossy non-superconducting materials from, e.g., deposited dielectrics, classical circuit elements with which the quantum computers communicate, and from the connections between the classical circuit elements and the quantum circuit elements, can lead to increased decoherence.

To increase superconducting qubit density and expand the number of superconducting qubits available for coupling in a quantum processor, such as a quantum annealer having superconducting quantum circuit elements, the processor and associated circuit elements can be constructed using 3D integration. That is, instead of fabricating the quantum circuit elements of the processor within a single plane of a chip that extends along one and/or two dimensions (e.g., x- and/or y-directions), the quantum circuit elements can also be formed in multiple chips that are coupled together along a third dimension (e.g., z-direction). An approach for achieving 3D integration is to couple the chips using bump bonding, in which the chips are joined to one another by, e.g., superconductor bump bonds, to form a stacked device (e.g., a stacked quantum computing device). In some implementations, bump bonds may be used to electrically couple together components from different chips within the stack in addition to physical coupling of the chips. Alternatively, bump bonds solely may be used to provide physical coupling of different chips. By using superconductor bump bonds for coupling, it is possible to achieve a reduction in the energy loss and decoherence that can otherwise occur with lossy non-superconductor materials.

Furthermore, in some implementations, the lossy materials and qubit control wiring may be formed on one or more chips within the stack that are separate from the chip or chips containing the qubits. By limiting the chip(s) containing the qubits to high quality (low loss) materials, the qubits are substantially isolated from lossy material and qubit decoherence can be reduced. Furthermore, by moving the control wiring off the chip(s) containing the qubits, the qubit layout and wiring constraints may be relaxed.

To further relax the layout constraints, the qubit readout elements also may be moved to the same chip on which the wiring and lossy materials are formed. However, readout resonators should maintain a modest level of coherence. A readout resonator, although strongly coupled to the environment with a low coupling quality factor Qc, will damp the qubit if the intrinsic quality factor Qi is too low. Additionally, to avoid crosstalk between qubits on one chip and the wiring on another chip, the wiring should not be exposed.

The present disclosure relates to devices and methods for integrating circuit elements in a stacked quantum computing device. A first chip in the stacked quantum computing device includes superconducting qubits formed from high quality, coherent materials (low loss materials) and is bonded to a second chip that contains one or more wiring layers, as well as qubit control and qubit readout elements, integrated with lossy dielectrics. By moving the wiring, readout and control elements to a second chip, the qubit layout constraints on the first chip (as well as the wiring layout constraints on the second chip) can be relaxed. Furthermore, moving the lossy dielectric material to the second chip allows the qubits on the first chip to maintain high coherence (e.g., Q of about 1,000,000 or more). The qubit readout elements on the second chip may be formed without lossy dielectric on their surface, such that the readout elements maintain moderate coherence (e.g., Qi of about 200,000 or more). Furthermore, a shielding layer may be formed on the second chip to shield superconducting qubits on the first chip from the wiring on the second chip, to reduce crosstalk. Moreover, the devices disclosed herein may be fabricated using processes that reduce residue and damage to the readout element, allowing the readout element to maintain moderate coherence.

FIG. 1A is a schematic illustrating a side view of an example of a stacked quantum computing device 100. The stacked quantum computing device 100 includes a first chip 102 and a second chip 104. The first chip 102 includes one or more quantum computing circuit elements (e.g., superconducting qubits) for use in performing data processing operations (e.g., quantum data processing operations). In an example, the first chip 102 includes a one-dimensional (1D) or two-dimensional (2D) array of superconducting qubits. The quantum computing circuit elements of the first chip 102 may be formed on and/or within a substrate. The substrate of the first chip may be formed from, e.g., a low loss dielectric suitable for quantum computing circuit elements, such as a silicon or sapphire wafer. Other materials may be used for the substrate instead.

The second chip 104 includes additional quantum computing circuit elements such as, e.g., qubit control elements and qubit readout elements. The second chip 104 also may include wiring. Examples of qubit control elements include a qubit Z-control element for tuning a frequency of a qubit, and a qubit XY-control element for exciting a qubit. Each control element may be operable to couple (e.g., capacitively couple) to a qubit on the first chip 102. A qubit readout element may include, e.g., a resonator operable to couple (e.g., inductively couple) to a qubit of the first chip 102. The control elements, readout elements and wiring on the second chip 104 may be formed from superconductor material on a substrate of the second chip. The substrate of the second chip may be formed from, e.g., a low loss dielectric suitable for quantum computing circuit elements, such as a silicon or sapphire wafer. Other materials may be used for the substrate instead. In some implementations, the substrate of the first chip is a different substrate to the substrate of the second chip.

The first chip 102 is aligned on top of the second chip 104 and connected physically to the second chip 104 using interconnects 106, such as bump bonds. In some implementations, the bump bonds 106 also provide an electrical connection between components of the first chip 102 and components of the second chip 104. In the present example, the first chip 102 is connected to the second chip 104 through superconductor bump bonds 106 (e.g., bump bonds including indium). In some implementations, a vacuum is maintained between the first chip 102 and the second chip 104.

The bump bonds 106 may include superconductor material to avoid energy loss and decoherence of superconducting qubits that may be located, e.g., on the first chip 102. For instance, suitable superconductor material for use as a bump bond 106 includes, but is not limited to, indium, lead, rhenium, palladium, or niobium having a thin layer of non-superconductor material such as gold (e.g., between about 1 nm and about 100 nm). The thickness of the bump bonds 106 may be set so that the first chip 102 and the second chip 104 are spaced to achieve a desired capacitive or inductive coupling between circuit elements on the first chip 102 and on the second chip 104. For example, a height of a gap 108 between the device surface of the first chip 102 and the structural element surface of the second chip 104 may be set to be between approximately 0.5 µm and approximately 100 µm (e.g., between approximately 10 µm and approximately 20 µm, between approximately 1 µm and 10 µm, between approximately 0.5 µm and approximately 20 µm, between approximately 0.5 µm and approximately 15 µm, between approximately 0.5 µm and approximately 10 µm, between approximately 0.5 µm and approximately 5 µm, or between approximately 0.5 µm and approximately 2.5 µm).

Figure 1B:
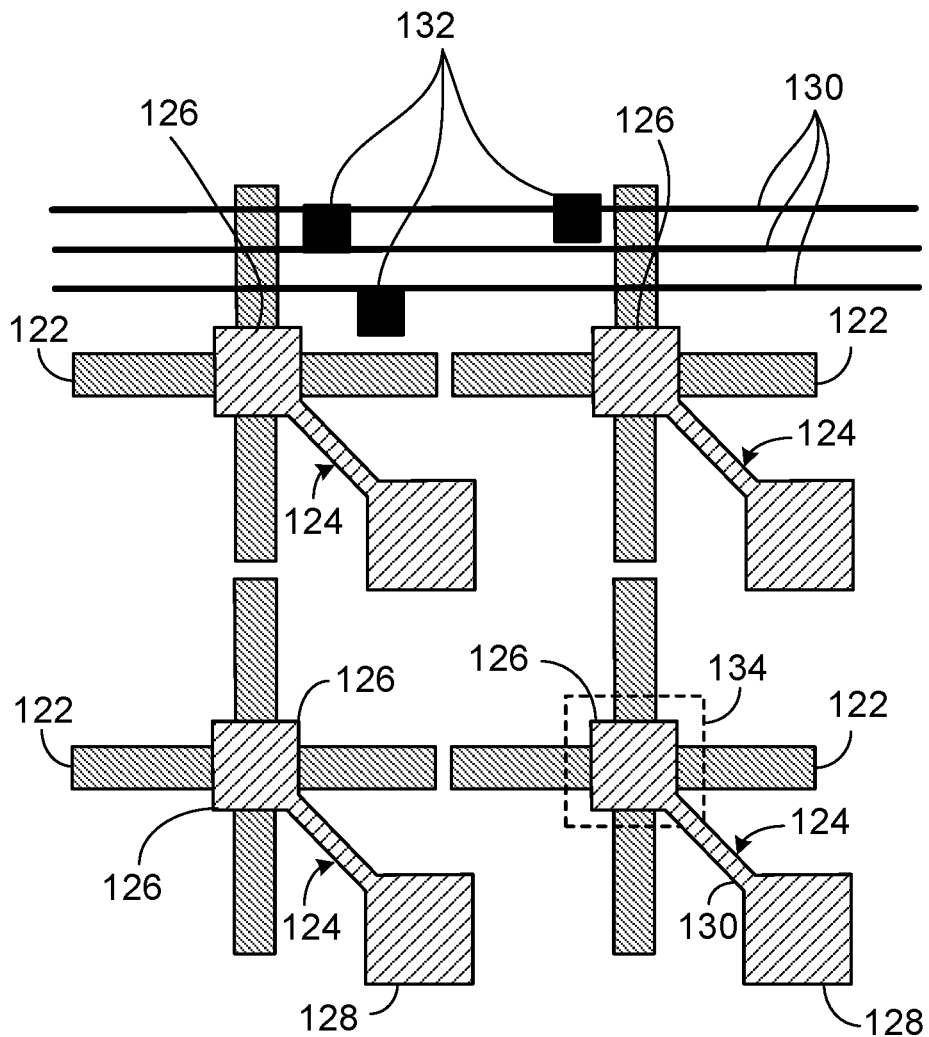
FIG. 1B is a schematic illustrating a top view of circuit elements from a first chip of a stacked quantum computing device overlaid with circuit elements from a second chip of an exemplary stacked quantum computing device.

FIG. 1B is a schematic illustrating a top view of circuit elements from a first chip as those circuit elements would be aligned with circuit elements from a second chip in an exemplary stacked quantum computation device (e.g., device 100). As shown in FIG. 1B, a first chip includes an array (e.g., a 2×2 array) of superconducting qubits 122. The qubits in the present example are Xmon transmon qubits represented generally in the shape of a "plus" sign having four arms. Qubits 122 may include, but are not limited to, qubits such as flux qubits, transmon qubits, and gmon qubits. The second chip includes an array of qubit readout devices 124, in which each qubit readout device 124 is aligned with a corresponding superconducting qubit 122 from the first chip. Each qubit readout device 124 includes a resonator element 128 electrically coupled to a pad element 126. Each pad element 126 can be aligned over a center of a corresponding superconducting qubit 122 on the first chip. The region of the superconducting qubit 122 over which the pad element 126 is aligned may be referred to as a readout region 134 of the superconducting qubit 122. In some implementations, the pad element 126 is operable to capacitively couple to the readout region 134 of the qubit 122. An amount of capacitance between the pad element and the qubit can vary depending on the relative sizes of the pad element 126 and the qubit 122. The resonator element 128 may be laterally displaced with respect to the superconducting qubit 122 and electrically coupled to the pad element 128 through an elongated arm 130. The resonator element 128 may include, e.g., a transmission line resonator (e.g., a distributed element resonator or a lumped element resonator) such as a co-planar waveguide, where the length of the resonator determines the resonator frequency. Each of the pad element 126, the arm 130 and the resonator element 128 may be formed from a superconductor thin film (e.g., Al).

The second chip can also include wiring elements (e.g., control wires 130). The wiring elements also may be formed from a superconductor thin film (e.g., Al). The wiring elements may include or may be coupled to control elements, such as a qubit Z-control or qubit XY-control element. In some implementations, the control element portions of the wiring elements may be aligned directly over (or under depending on the orientation of the chips) one or more portions of a corresponding qubit on the first chip. In some implementations, control element portions of the wiring elements may be laterally displaced from one or more portions of a corresponding qubit such that the control element and the qubit do not overlap. Pads 132 indicate the possible location of bump bonds, though bump bonds may be positioned at other locations. The thickness of the substrates for each chip in the stacked quantum computation device may be between. e.g., approximately 10 microns and approximately 1000 microns. Examples of high quality, low loss substrate material include single crystal silicon and sapphire.

Figure 2A:
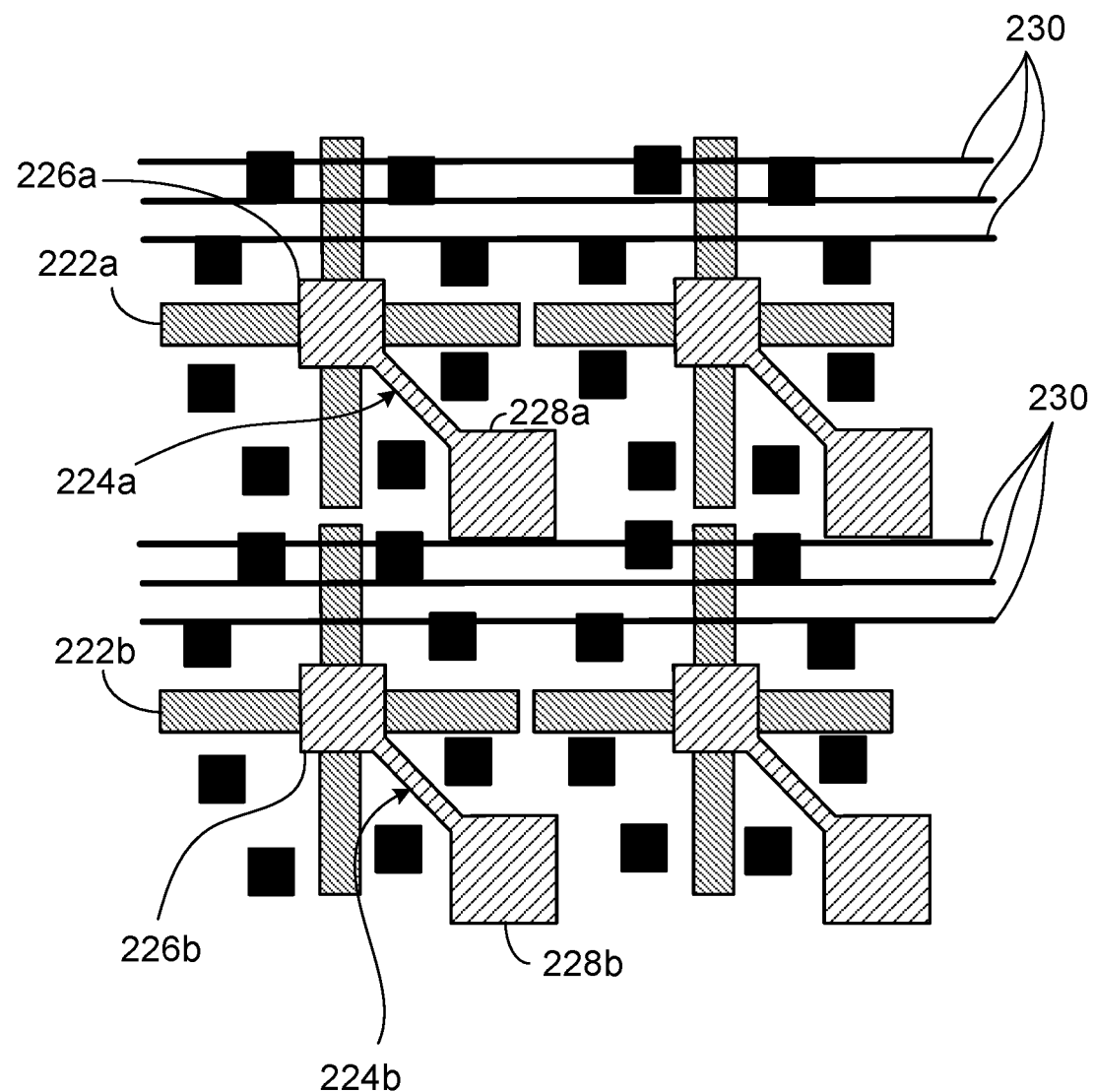
FIG. 2A is a schematic illustrating a top view of circuit elements from a first chip of a stacked quantum computing device overlaid with circuit elements from a second chip of an exemplary stacked quantum computing device.
Figure 2B:
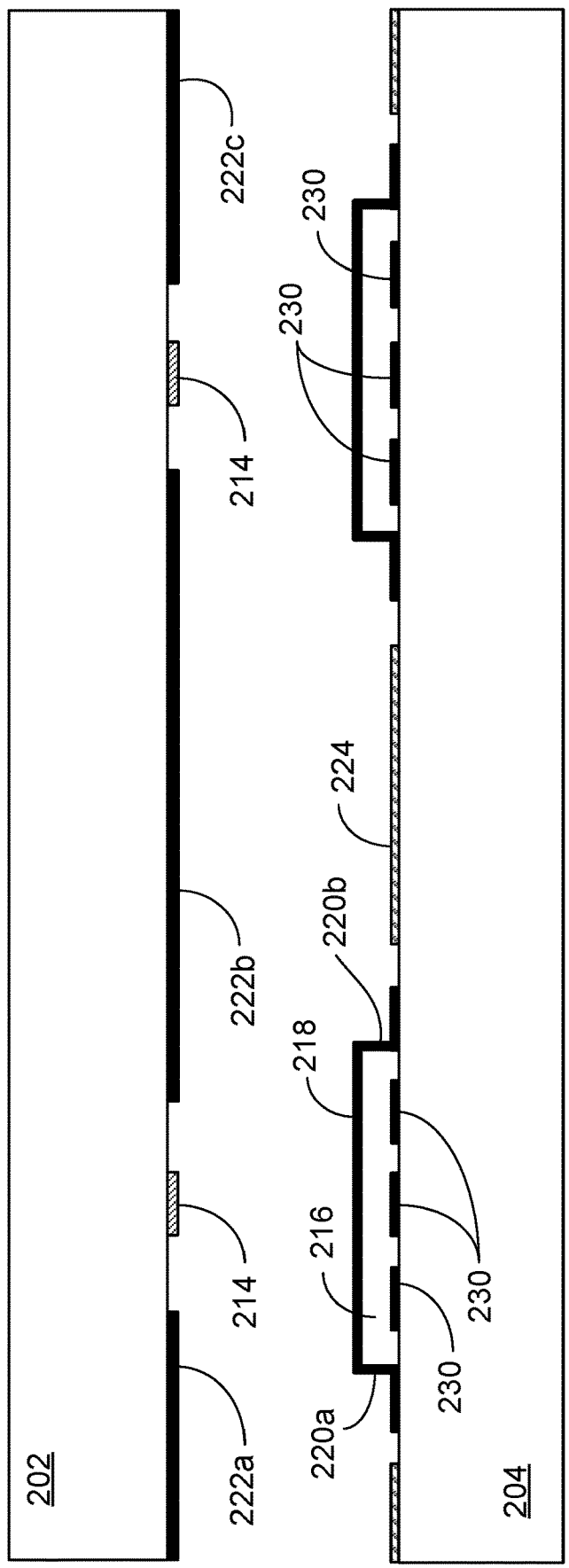
FIG. 2B is a schematic illustrating a cross-section of a stacked quantum computing device.

FIG. 2A is a schematic illustrating a top view through a stacked quantum computation device (such as device 100) and showing circuit elements from a first chip aligned with circuit elements from a second chip, discussed in more detail with reference to FIG. 1B. The first chip includes an array of superconducting qubits (e.g., qubits 222a, 222b). The second chip includes wiring elements 230, qubit readout devices (e.g., 224a, 224b), and qubit control elements. Pads for chip-to-chip interconnects, such as bump bonds, are illustrated as distributed in various locations. The wiring elements 230 may include or may be coupled to the qubit control elements. By forming the wiring elements 230 on a separate chip from the superconducting qubits, the wiring layout constraints may be relaxed given that wiring elements 230 no longer need to be routed around the qubits. Rather, in some implementations, such as shown in FIG. 2B, the wiring elements 230 on the second chip may overlap portions of the superconducting qubits on the first chip. The qubit readout devices 224a, 224b may include a portion, such as pad elements 226a, 226b (see FIG. 2A), that overlap a part of a corresponding superconducting qubit (e.g., qubit 222a, 222b, respectively) formed on the first chip when the first chip is bonded to the second chip. The qubit readout devices 224a, 224b also may include resonator elements 228a, 228b, respectively that do not overlap the qubits on the first chip. Resonator elements 228a and 228b are illustrated in FIGS. 1B and 2A as solid pads but may include, e.g., a transmission line resonator (e.g., a distributed element resonator or a lumped element resonator), such as a co-planar waveguide.

FIG. 2B is a schematic illustrating a cross-sectional view through an exemplary stacked quantum computation device, such as the device shown in FIG. 2A. As explained herein, the arrangement of circuit elements shown in FIG. 2B is slightly different than the arrangement of circuit elements shown in FIG. 2A, though like reference characters refer to like features. The stacked device includes a first chip 202 bonded (e.g., bump bonded) to a second chip 204. The substrates of the first chip 202 and the second chip 204 may be formed from, e.g., a low loss dielectric suitable for quantum computing circuit elements, such as a silicon or sapphire wafer. The cross-section illustrated in FIG. 2B includes portions 222a, 222b, 222c of neighboring superconducting qubits, as well as portions 214 (not shown in FIG. 2A for ease of illustration) of ground planes formed on the first chip 202. The ground planes and qubits may be formed, at least in part, from superconductor metal film, such as Al. The portions 222a, 222b, 222c may correspond to elongated arms of the neighboring superconducting qubits (e.g., in the case the qubits include xmon qubits). In some implementations, the superconductor ground planes 214 are located between the neighboring superconducting qubits.

The second chip 204 includes wiring elements 230, which may include qubit control elements (e.g., qubit Z-control elements and/or qubit XY-control elements). The second chip 204 also may include one or more qubit readout devices, which may include elements such as a resonator element (e.g., 228a, 228b) and a pad element (e.g., 226a, 226b) as illustrated in FIG. 2A. A pad element 226a is shown in FIG. 2B overlapping a portion of qubit 222b. In the cross-section illustrated in FIG. 2B, wiring elements 230 on the second chip 204 pass at least partially underneath portions 222a, 222b, 222c, of superconducting qubits located on the first chip 202. To reduce crosstalk between the wiring elements 230 and the qubits under which the wiring elements 230 pass, the wiring elements are covered by a shielding layer 218, which blocks fields from the qubits and wiring elements from interfering with one another. Such interference may cause the superconducting qubits to dampen and decohere. To support the shielding layer 218, a dielectric layer 216 is provided on the wiring elements 230. The dielectric layer 216 may include lossy dielectrics, such as tetraethyl orthosilicate (TEOS), silicon dioxide, or silicon nitride. In general, a "lossy" dielectric may be defined relative to a quality factor (Q) of a device which incorporates the dielectric. For example, for a device having a quality factor Q, a dielectric of that device may be considered lossy if the dielectric has a loss tangent larger than 1/Q. In some implementations, a lossy dielectric material includes, e.g., a dielectric material with a loss tangent at microwave frequencies (between about 1 and about 10 GHz) that is above at least 1e−4 or at least 1e−5. The lossy dielectric material may be deposited, e.g., using a plasma deposition process. A thickness of a deposited dielectric material can range between about 50 nm and about 2000 nm.

The shielding layer 218 includes a superconductor material, such as Al, and may be deposited over the dielectric layer 216 to cover the dielectric layer 216. The shielding layer 218 may be deposited by, e.g. a physical vapor deposition process. In some implementations, a surface of the dielectric layer 216 is completely covered by the shielding layer 218, including the sidewalls of the dielectric layer 216 (e.g., sidewalls 220a and 220b), effectively encapsulating the surface of the dielectric layer 216 that is not formed on the second chip 204. In some cases, the shielding layer covers just the surface of the dielectric layer facing the first chip 202. A thickness of superconductor layer (e.g., metal layer) can range from about 10 nm to about 1000 nm.

The lossy dielectric may lead to a low intrinsic quality factor Qi for the qubit readout devices 224, and thus coherence that is too low for the qubit readout elements to function properly. To preserve the coherence of the qubit readout devices 224, a dielectric layer is not provided on the readout devices 224. For example, after forming dielectric layer 216 on chip 204, portions of the dielectric layer 216 may be removed to form an opening through which the qubit readout device 224 is exposed.

Though wiring elements 230 are shown in FIG. 2B as a single layer of superconductor material, multiple layers of superconductor material may be formed as part of wiring elements 230, where the multiple layers of superconductor material are embedded within dielectric material. An example of a multi-layer stack is described with reference to FIG. 6.

Figure 3A:
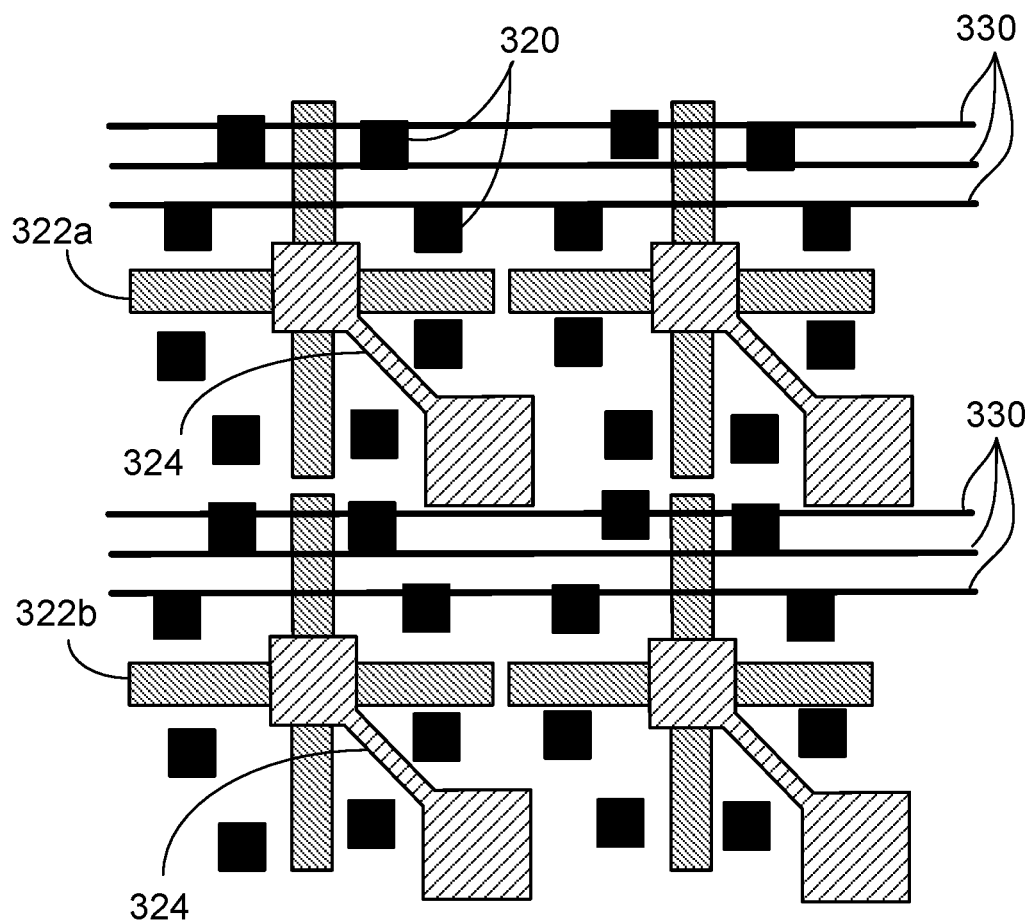
FIG. 3A is a schematic illustrating a top view of circuit elements from a first chip of a stacked quantum computing device overlaid with circuit elements from a second chip of an exemplary stacked quantum computing device

In some implementations, portions of the qubit control elements need to interact with the superconducting qubits on the first chip (e.g., inductively or capacitively couple to the qubits to tune or excite the qubits) and therefore cannot be isolated by a shielding layer. FIG. 3A is a schematic illustrating a top view through a stacked quantum computation device (such as device 100) and showing circuit elements from a first chip aligned with circuit elements from a second chip, as discussed herein with respect to FIGS. 1B and 2A. In contrast to FIG. 2A, the section identified by dashed line B-B indicates a region in which the qubit control elements couple to the superconducting qubits of the first chip.

Figure 3B:
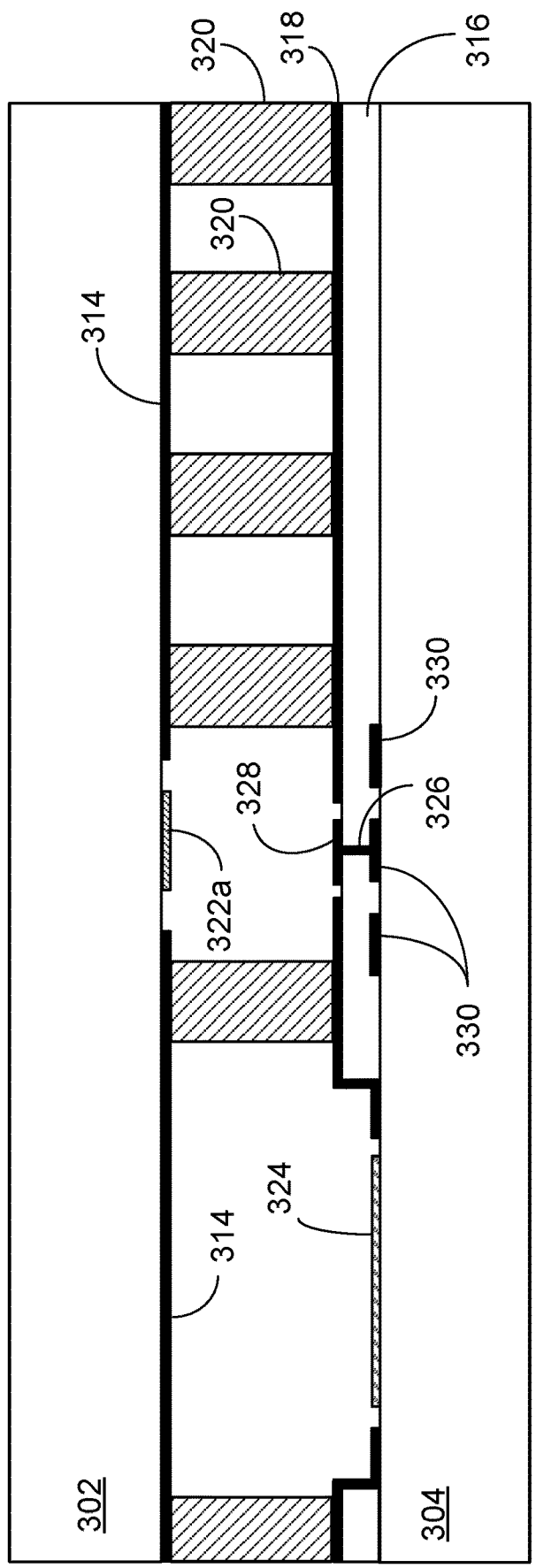
FIG. 3B is a schematic illustrating a cross-section of a stacked quantum computing device.

FIG. 3B is a schematic illustrating a cross-sectional view through a stacked quantum computation device, such as the device shown in FIG. 3A. The stacked device includes a first chip 302 bonded (e.g., bump bonded) to a second chip 304. The substrates of the first chip 302 and the second chip 304 may be formed from, e.g., a low loss dielectric suitable for quantum computing circuit elements, such as a silicon or sapphire wafer. The cross-section illustrated in FIG. 3B includes a portion 322a of a superconducting qubit, as well as portions 314 of ground planes formed on the first chip 302. The ground planes and qubits may be formed, at least in part, from superconductor metal film, such as Al. The portion 322a may correspond to an elongated arm of a superconducting qubit (e.g., in the case the qubits include xmon qubits). Bump bonds 320 (e.g., superconductor bump bonds) physically couple the first chip 302 to the second chip 304.

The second chip 304 includes wiring elements 330, which may include qubit control elements (e.g., qubit Z-control elements and/or qubit XY-control elements), formed on the second chip 304. The second chip 304 also may include one or more qubit readout devices 324, such as a resonator element or a pad element. As explained with respect to FIG. 2B, the wiring elements 330 may be covered by a shielding layer 318 (e.g., a superconductor film such as an Al film), which isolates the wiring elements 330 from the qubits on the first chip 302. To support the shielding layer 318, a dielectric layer 316 is provided on the wiring elements 330. The dielectric layer 316 may include lossy dielectrics, such as tetraethyl orthosilicate (TEOS), silicon dioxide, or silicon nitride.

In contrast to FIG. 2B, FIG. 3B illustrates a region in which the shielding is absent so that a qubit control element on the second chip 304 may couple (e.g., capacitively couple) to a qubit on the first chip 302. In the example shown in FIG. 3B, via 326 is formed within the dielectric layer 316. Via 326 extends from a surface of the dielectric layer 316 through the dielectric layer 316 to wiring element 330 and may be filled with a superconductor metal, such as Al, to form a via interconnect. A contact pad 328 is formed on via interconnect 326 and serves as a qubit control element. The contact pad 328 may be surrounded laterally by the shielding layer 318, but physically separate from the shielding layer 318 (e.g., a gap may be located between the shielding layer 318 and the exposed contact pad 328). The contact pad 328 also may be formed from a superconductor metal, such as an Al thin film.

In some implementations, the contact pad 328 on the second chip 304 is aligned under or over a portion of superconducting qubit (e.g., qubit 322a) on the first chip 302 such that the contact pad 328 overlaps (e.g., directly faces) the superconducting qubit when the two chips are bonded together. In some implementations, the contact pad 328 on the second chip 304 is displaced laterally from a portion of superconducting qubit on the first chip 302 such that the contact pad 328 does not overlap the superconducting qubit when the two chips are aligned and bonded together.

As explained with respect to FIG. 2B, a dielectric layer is not provided on the qubit readout device 324 to preserve the coherence of the qubit readout device 324. In some implementations, a portion of the qubit readout element is aligned with superconductor ground plane 314 of the first chip 302.

Figure 4A:
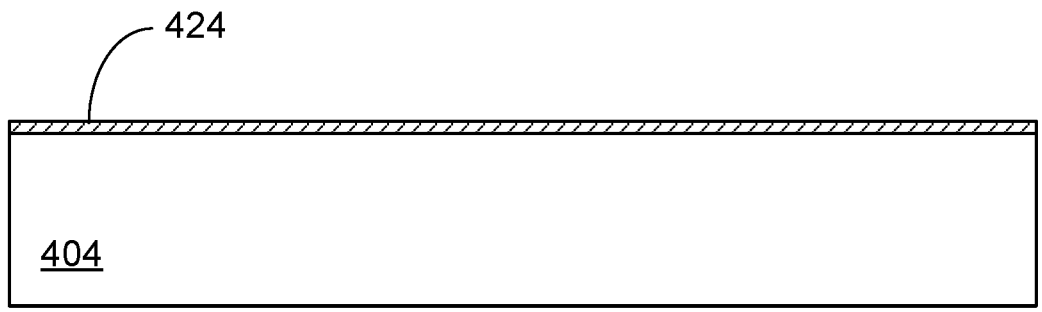
FIGS. 4A-4F are schematics illustrating an exemplary process for fabricating a chip for a stacked quantum computing device.

FIGS. 4A-4F are schematics illustrating an exemplary process for fabricating a chip (as second chip 204 or chip 304) that will have qubit readout and control elements for a stacked quantum computing device. As shown in FIG. 4A, a chip 404 is provided. Chip 404 may be formed from a dielectric substrate, e.g., a silicon or sapphire substrate. A first superconductor layer 424 is provided on a surface of the chip 404. Superconductor layer 424 may include, e.g., aluminum, niobium-titanium, or other materials or alloys having superconducting properties below a superconducting critical temperature. The superconductor layer 424 may be deposited using, e.g., a physical vapor deposition process, among other techniques.

Figure 4B:
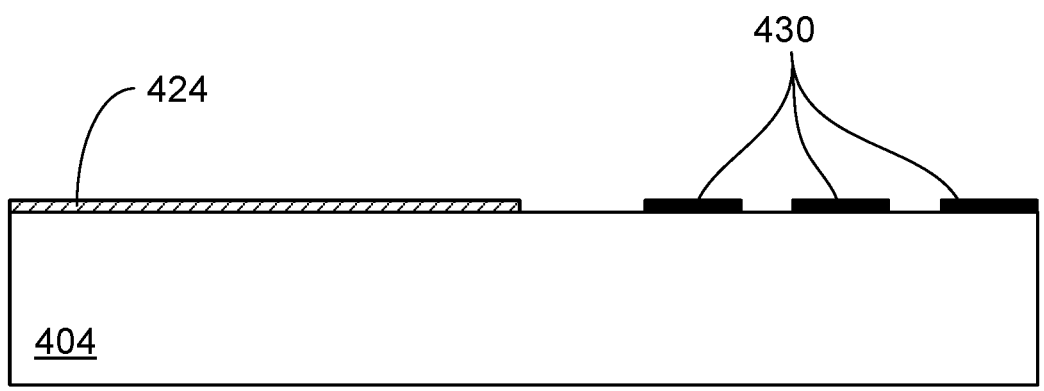

As shown in FIG. 4B, the superconductor layer 424 is patterned. Patterning may entail selectively removing portions of already deposited superconductor material through, e.g., selective etching or a lift-off process. Alternatively, the layer 424 may be patterned by depositing the superconductor material through one or more masks in the process step depicted by FIG. 4A. Patterning the superconductor layer 424 defines distinct structures, such as one or more wiring elements 430.

Figure 4C:
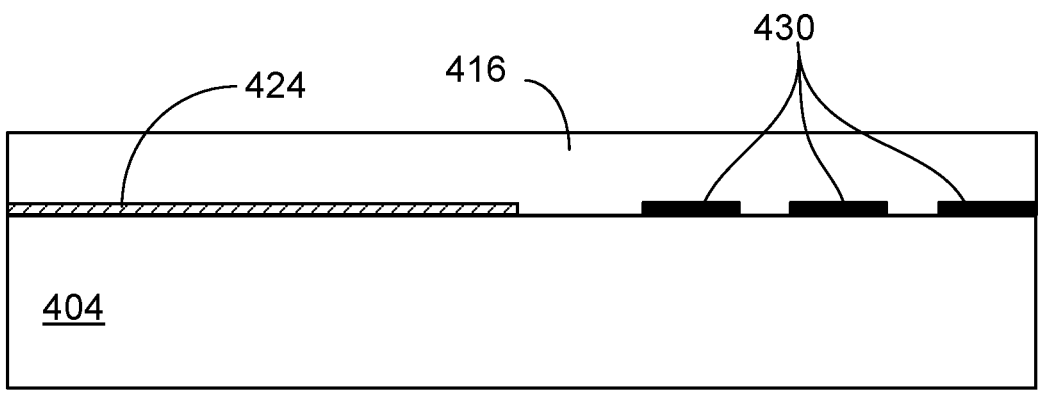

As shown in FIG. 4C, a dielectric layer 416 then is provided on the superconductor layer 424. The dielectric layer 416 may be deposited using, e.g., a physical vapor deposition process or a plasma deposition process, among other techniques. The dielectric layer 416 can include dielectric materials such as TEOS, silicon dioxide, or silicon nitride. Typically, the deposited dielectric is a lossy material, having a loss tangent at microwave frequencies above at least 1e-4 or at least 1e-5 at frequencies between about 1 GHz and about 10 GHz.

Figure 4D:
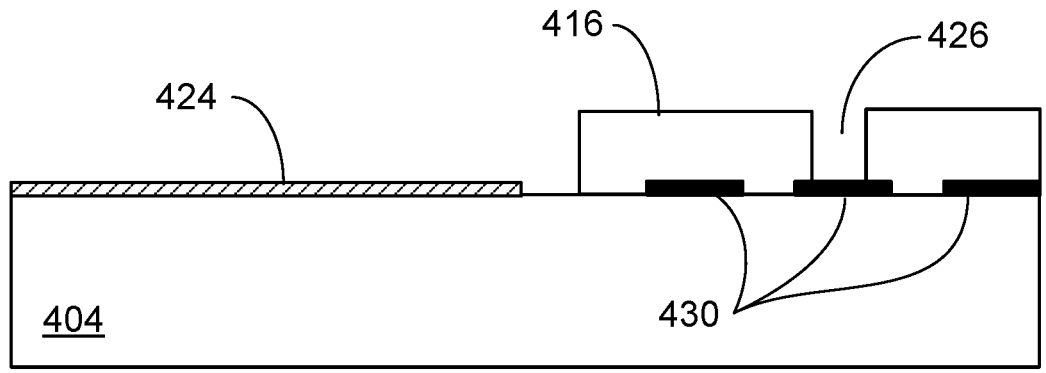

As shown in FIG. 4D, dielectric layer 416 is patterned to remove portions of dielectric material. For example, in some implementations, portions of the dielectric layer 416 are removed to expose superconductor layer 424 in regions where a qubit readout element will be formed. In some implementations, portions of the dielectric layer 416 are removed to provide a via 426 to wiring elements 430 in regions where a qubit control element will be formed. In some implementations, dielectric layer 416 deposited over the superconductor layer 424 is not removed during the patterning step. Patterning dielectric layer 416 may include selectively etching the dielectric layer, among other techniques.

Figure 4E:
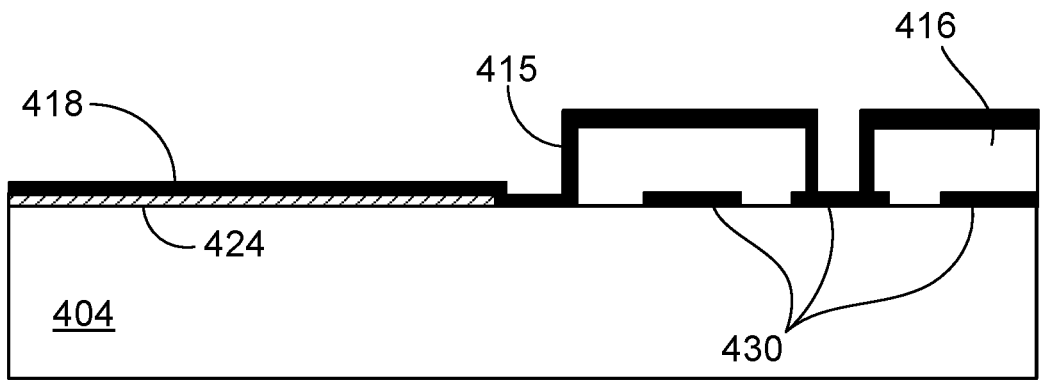

As shown in FIG. 4E, a second superconductor layer 418 is provided. The second superconductor layer may be deposited, e.g., on a surface of the dielectric layer 416, on a surface of the superconductor layer 424, and on the exposed chip 404 (e.g., exposed dielectric substrate). In some implementations, the second superconductor layer may be deposited, e.g., on a surface of the dielectric layer 416. In some implementations, the second superconductor layer 418 is deposited within the via 426 to form a via interconnect. In some implementations, the second superconductor layer 418 is deposited on a sidewall 415 of the dielectric layer 416. The second superconductor layer 418 may be the same or different superconductor material as first superconductor layer 424. The second superconductor layer 424 may be deposited, e.g., by a physical vapor deposition process, among other techniques.

Figure 4F:
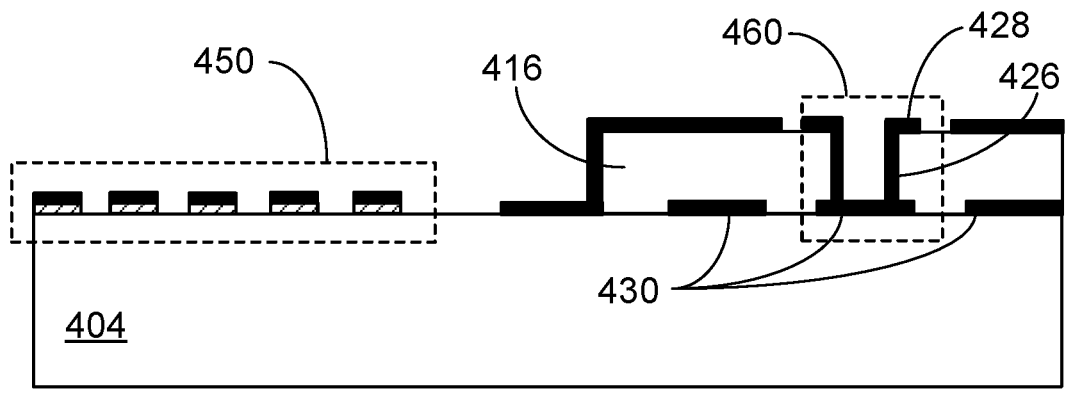

As shown in FIG. 4F, the second superconductor layer 418 is patterned. In some implementations, both the second superconductor layer 418 and the superconductor layer 424 are selectively patterned simultaneously to form a circuit element, such as a qubit readout element 450 (e.g., a co-planar waveguide qubit readout resonator).

In some implementations, the second superconductor layer 418 is patterned and a portion of the second superconductor layer 418 and a portion of the dielectric layer 416 are removed in a same or in subsequent steps, such that a portion of a sidewall 415 of the dielectric layer 416 is exposed and a portion of superconductor layer 424 is exposed. A portion of exposed dielectric layer sidewall 415 may be exposed (uncapped by superconductor layer 418) while still achieving high quality (e.g., better coherence properties) for the superconducting qubit and qubit readout element. The exposed superconductor layer 424 may be selectively patterned to form a circuit element, such as a qubit readout element.

Additionally, in some implementations, the second superconductor layer 418 is selectively patterned to define a qubit control element (e.g., a qubit Z-control element or a qubit XY control element). For instance, second superconductor layer 418 is patterned in FIG. 4F to define a contact pad 428 that forms part of a qubit control element 460. The patterning removes portions of the second superconductor layer 418 to electrically isolate layer 418 from the contact pad 428 and from the qubit readout element 424. The patterned layer 418 also serves as the shielding layer.

Once fabrication of chip 404 is completed, the chip 404 may be aligned and bonded (e.g., through flip-chip bonding) to a separate chip containing superconducting qubits (e.g., such as chip 202 or chip 302). In some implementations, the fabrication process described with respect to FIGS. 4A-4F may result in the qubit readout element exhibiting better coherence properties. To achieving moderate Qi of the qubit readout element, it is preferable to fabricate the qubit readout element to have a high quality metal-substrate interface and substrate-air interface in the exposed substrate surface regions adjacent to the qubit readout element. To keep these interfaces having high quality throughout the fabrication process, the patterning of the qubit readout element is left until the last or close to the last process step. In this way, damage to the interfaces from etching steps as well as residue can be reduced, resulting in improved qubit readout element quality factor.

Figure 5D:
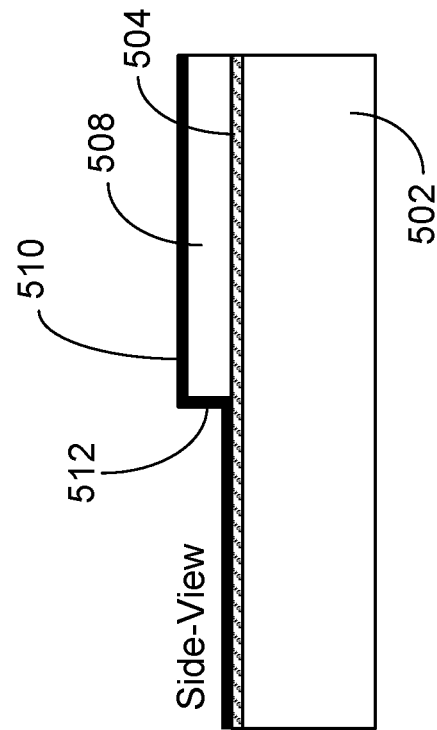
FIGS. 5A-SE are schematics illustrating an exemplary process for fabricating a chip for a stacked quantum computing device.
Figure 5D:

As shown in FIG. 4F, the qubit readout device 450 is depicted as physically separate from the wiring elements 430 (e.g., as a result of the superconductor layer patterning step). In some implementations, the qubit readout device 450 is physically connected to the wiring elements 430 and/or to a qubit control element. FIGS. 5A-5E are schematics illustrating an exemplary process for fabricating a chip for a stacked quantum computing device, as viewed from a top-view and side view at different steps of a fabrication process. As shown in FIG. 5A, a chip 502 is provided. Chip 502 may be formed from a dielectric substrate, e.g., a silicon or sapphire substrate. A first superconductor layer 504 is deposited on a surface of chip 502. Superconductor layer 504 may include, e.g., aluminum, niobium-titanium, or other materials or alloys having superconducting properties below a superconducting critical temperature. The superconductor layer 504 may be deposited using, e.g., a physical vapor deposition process, among other techniques.

As shown in FIG. 5B, the superconductor layer 504 is patterned. Patterning may entail selectively removing portions of already deposited superconductor material through, e.g., selective etching or a lift-off process. Alternatively, the layer 504 may be patterned by depositing the superconductor material through one or more masks in the process step depicted by FIG. 5A. FIG. 5B defines distinct structures defined by a patterning process, including one or more control wires 506. Portions of the first superconductor layer 504 that are removed expose the underlying chip 502.

As shown in FIG. 5C, a dielectric layer 508 then is formed on the superconductor layer 504 and on chip 502. Dielectric layer 508 may be deposited using, e.g., a physical vapor deposition process or a plasma deposition process, among other techniques. The dielectric layer 508 can include dielectric materials such as TEOS, silicon dioxide, or silicon nitride. Typically, the deposited dielectric is a lossy material, having a loss tangent at microwave frequencies above at least 1e−4 or at least 1e−5 at frequencies between about 1 GHz and about 10 GHz. The dielectric layer 508 may be patterned (e.g., through an etch or lift-off process) to expose a region in which the qubit readout element will be formed.

As shown in FIG. 5D, a second superconductor layer 510 is formed on the patterned dielectric layer 508, the first superconductor layer 504 (including, e.g., the control wire 506) and the chip 502. The deposition may be a conformal deposition, such that the second superconductor layer 510 covers the sidewalls of the dielectric layer 508. The second superconductor layer 510 can be of a same superconductor material as first superconductor layer 504, or can be of a different superconductor material.

Figure 5E:
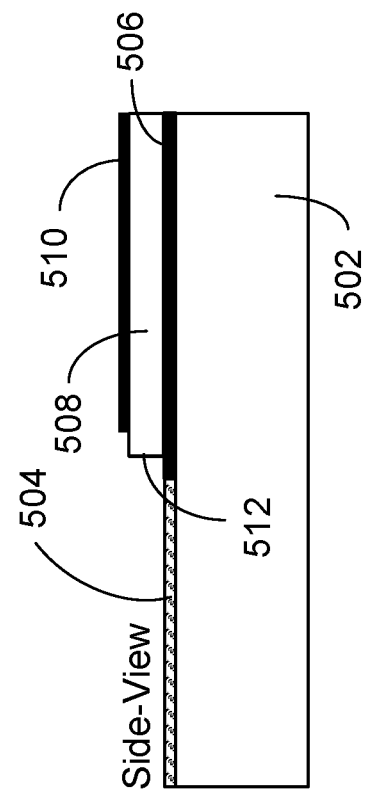
Figure 5E:
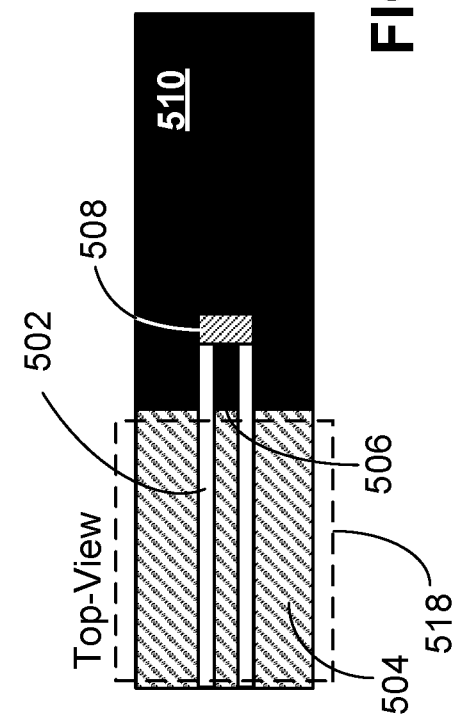

The first superconductor layer 504 and the second superconductor layer 510 then are patterned as shown in FIG. 5E. In some implementations, the second superconductor layer 510 and the first superconductor layer 504 are selectively patterned to define different structures. For example, the second superconductor layer 510 may be patterned to expose the control wire 506, a portion of the dielectric layer 508 and a portion of the first superconductor layer 504. In contrast, the first superconductor layer 504 may be patterned to define a qubit readout element 518. The patterning process can occur in a single etching step or multiple etching steps. In some implementations, the dielectric layer 508 is patterned to expose a portion of the dielectric layer 508. For example, as seen in the side view of FIG. 5E, sidewall 512 is exposed through a patterning step. Once fabrication of the chip is completed, the chip may be aligned and bonded (e.g., through flip-chip bonding) to a separate chip containing superconducting qubits (e.g., such as chip 202 or chip 302).

Figure 6:
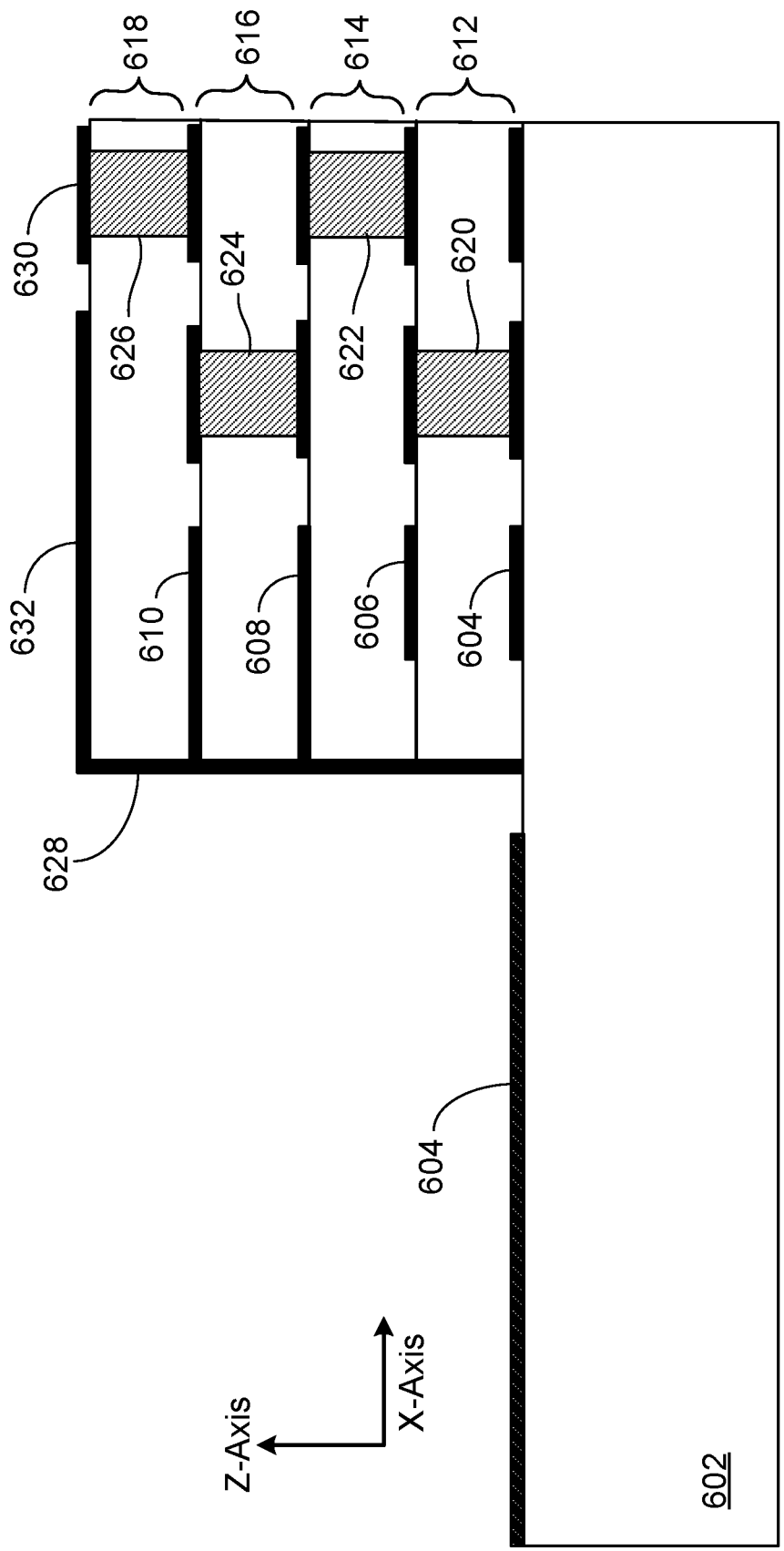
FIG. 6 is a schematic illustrating a side view of an exemplary chip to be used in a stacked quantum computing device.

In some implementations, multiple layers of dielectric material and multiple layers of wiring elements may be fabricated on the chip. FIG. 6 is a schematic illustrating a side view of an exemplary chip to be used in a stacked quantum computing device. Chip 602 may include one or more qubit readout elements, qubit control elements, and/or wiring elements. Chip 602 may be formed, in part, from material having a relatively high loss (e.g., having a loss tangent of at least about 1e−4 or at least about 1e−5 at frequencies between about 1 GHz and about 10 GHz). Chip 602 may be aligned and bonded to a chip that includes superconducting qubits to provide a stacked quantum computation device, such as device 100.

As shown in FIG. 6, chip 602 may be formed from a dielectric substrate. (e.g., single crystal silicon or sapphire) on which is formed a first layer 604 of superconductor material (e.g., an Al thin film). The first layer 604 of superconductor material may be patterned to define, e.g., one or more qubit readout elements, qubit control elements and/or wiring elements. Additional layers (e.g., layers 606, 608, 610) of superconductor material (e.g., Al) arranged in a stack over the portions of the first superconductor layer 604 may be formed on chip 602. The layers 606, 608, 610 may also be patterned to define wiring elements and/or qubit control elements. The layers 604, 606, 608, and 610 of superconductor material in the stack may be separated from one another by corresponding layers (e.g., 612, 614, 616, 618) of dielectric material. The dielectric material may include lossy dielectrics, such as, e.g., TEOS, silicon dioxide, or silicon nitride.

A microstrip geometry, where two superconductor layers are separated by a dielectric layer (e.g., superconductor layers 610 and 608, separated by dielectric layer 616) may be formed on chip 602. In some implementations, a stripline geometry, where three superconductor layers are separated by two dielectric layers (e.g., a layer stack including superconductor layer 606, dielectric layer 614, superconductor layer 608, dielectric layer 616, and superconductor layer 610) such that one superconductor signal layer (e.g., superconductor layer 608) is sandwiched between two superconductor layers acting as ground layers (e.g., superconductor layers 606 and 610) may be formed on chip 602. In some implementations, multi-layer microstrip geometries, multi-layer stripline geometries, or a combination thereof may be formed on chip 602.

One or more of the different layers of superconductor material may be electrically coupled to one another through one or more via interconnects (e.g., via interconnect 620, 622, 624, 626). Via interconnects 620, 622, 624, 626 may be fabricated in a similar manner as the via interconnects 426 detailed in FIGS. 4A-4F. In some implementations, the vias are filled with superconductor material (e.g., aluminum) to form the via interconnects. The vias may be filled using, e.g., a physical vapor deposition process. The location of the via interconnects may depend on the desired routing layout of the wiring elements and the qubit control elements.

A top layer 628 of superconductor material may be patterned to define a qubit control element 630 (e.g., a qubit Z-control element or a qubit XY control element) and a shielding layer 632. The shielding layer 632 may isolate electromagnetic fields from the wiring elements and from qubits provided on a separate chip from interfering with one another. In some implementations, the top layer 628 of superconductor material also is deposited to cover the sidewalls of the dielectric layers 612, 614, 616, and 618.

For the purposes of this disclosure, a superconductor (alternatively superconducting) material can be understood as material that exhibits superconducting properties at or believe a superconducting critical temperature. Examples of superconducting material include aluminum (superconductive critical temperature of 1.2 kelvin) and niobium (superconducting critical temperature of 9.3 kelvin).

An example of a superconductor material that can be used in the formation of quantum computing circuit elements is aluminum. Aluminum may be used in combination with a dielectric to establish Josephson junctions, which are a common component of quantum computing circuit elements. Examples of quantum computing circuit elements that may be formed with aluminum include circuit elements such as superconducting co-planar waveguides, quantum LC oscillators, qubits (e.g., flux qubits or charge qubits), or superconducting quantum interference devices (SQUIDs) (e.g., RF-SQUID or DC-SQUID), among others.

Aluminum may also be used in the formation of superconducting classical circuit elements that are interoperable with superconducting quantum computing circuit elements as well as other classical circuit elements based on complementary metal oxide semiconductor (CMOS) circuitry. Examples of classical circuit elements that may be formed with aluminum include rapid single flux quantum (RSFQ) devices, reciprocal quantum logic (RQL) devices and ERSFQ devices, which are an energy-efficient version of RSFQ that does not use bias resistors. Other classical circuit elements may be formed with aluminum as well. The classical circuit elements may be configured to collectively carry out instructions of a computer program by performing basic arithmetical, logical, and/or input/output operations on data, in which the data is represented in analog or digital form.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

For the purposes of this disclosure, superconducting qubits are represented as xmon qubits. However, the subject matter of the disclosure may be implemented with other suitable superconducting qubits. For example, superconducting qubits include gmon qubits, transmon qubits, or fluxmon qubits, among other types of qubits.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency. e.g., light-matter interfaces where light is used for transmission and matter for storing and preserving the quantum features of quantum data such as superposition or quantum coherence.

Quantum computing circuit elements may be used to perform quantum processing operations. That is, the quantum computing circuit elements may be configured to make use of quantum-mechanical phenomena, such as superposition and entanglement, to perform operations on data in a non-deterministic manner. Certain quantum computing circuit elements, such as qubits, may be configured to represent and operate on information in more than one state simultaneously. Examples of superconducting quantum computing circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum computing circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum computing circuit elements and/or superconducting classical circuit elements, such as the circuit elements described herein, the superconducting circuit elements are cooled down within a cryostat to temperatures that allow a superconductor material to exhibit superconductor properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Other implementations are within the scope of the following claims.

What is claimed is:

1. A device comprising:
    a first chip comprising
        a first dielectric substrate and
        a qubit on the first dielectric substrate;
    a second chip bonded to the first chip, the second chip comprising
        a second dielectric substrate,
        a qubit readout element on the second dielectric substrate,
        a control wire on the second dielectric substrate, wherein a portion of the control wire overlaps the qubit,
        a dielectric layer covering the control wire, and
        a shielding layer covering the dielectric layer,
    wherein the shielding layer is arranged between the portion of the control wire and the qubit to reduce crosstalk between the control wire and the qubit by isolating electromagnetic fields from the control wire and from the qubit from interfering with one another.

2. The device of claim 1, wherein the dielectric layer comprises an opening through which the qubit readout element is exposed.

3. The device of claim 1, wherein the dielectric layer comprises a dielectric material having a loss tangent greater than about $10^{-5}$ at a frequency between about 1 GHz and about 10 GHz.

4. The device of claim 1, wherein the qubit comprises a readout region, and
    wherein the qubit readout element overlaps the readout region of the qubit.

5. The device of claim 4, wherein the qubit readout element comprises a resonator element electrically coupled to a pad element, and wherein the pad element overlaps the readout region of the qubit without the resonator element overlapping the readout region of the qubit.

6. The device of claim 5, wherein the first chip comprises a ground plane, and wherein the resonator element overlaps the ground plane.

7. The device of claim 1, wherein the dielectric layer comprises:
    a via extending from a surface of the dielectric layer through the dielectric layer to the control wire;
    an interconnect within the via and electrically coupled to the control wire; and
    a control contact on the surface of the dielectric layer and electrically coupled to the interconnect.

8. The device of claim 7, wherein the control contact is laterally surrounded by the shielding layer and physically separate from the shielding layer.

9. The device of claim 8, wherein the control contact overlaps the qubit.

10. The device of claim 9, wherein the control contact is displaced laterally from the qubit, without overlapping the qubit.

11. The device of claim 1, wherein the shielding layer covers a sidewall of the dielectric layer.

12. The device of claim 1, wherein each of the qubit readout element, the control wire, and the shielding layer is a superconductor.

13. The device of claim 1, wherein the second chip comprises a plurality of control wires and a plurality of dielectric layers,
wherein the plurality of control wires are embedded within the plurality of dielectric layers, and
wherein the shielding layer covers the plurality of dielectric layers.

14. The device of claim 1, wherein the first chip is bump bonded to the second chip.

15. A quantum computing circuit device comprising:
a first chip comprising
a first dielectric substrate and
a qubit on the first dielectric substrate;
a second chip bonded to the first chip, the second chip comprising:
a second dielectric substrate;
a first superconductor layer on the second dielectric substrate, wherein a first region of the first superconductor layer forms a qubit readout element and a second region of the first superconductor layer forms a qubit control element;
a dielectric layer on the second region of the first superconductor layer;
a via in the dielectric layer to expose a portion of the qubit control element, the via extending from a surface of the dielectric layer to the portion of the qubit control element that is exposed;
a second superconductor layer on the dielectric layer, wherein the second superconductor layer forms an interconnect within the via, the interconnect contacting the portion of the qubit control element that is exposed, and wherein the second superconductor layer forms a shielding layer that is electrically isolated from the interconnect
wherein the shielding layer is arranged between the portion of the qubit control element and the qubit on the first chip to reduce crosstalk between the portion of the qubit control element and the qubit by isolating electromagnetic fields from the qubit control element and from the qubit from interfering with one another.

* * * * *